(12) United States Patent
Bonen

(10) Patent No.: US 10,055,346 B2
(45) Date of Patent: *Aug. 21, 2018

(54) POLARITY BASED DATA TRANSFER FUNCTION FOR VOLATILE MEMORY

(71) Applicant: Intel Corporation, Santa Clara, CA (US)

(72) Inventor: Nadav Bonen, Ofer (IL)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/681,965

(22) Filed: Aug. 21, 2017

(65) Prior Publication Data

US 2018/0067852 A1 Mar. 8, 2018

Related U.S. Application Data

(63) Continuation of application No. 14/582,546, filed on Dec. 24, 2014, now Pat. No. 9,740,610.

(51) Int. Cl.
*G06F 12/00* (2006.01)
*G06F 12/06* (2006.01)
(Continued)

(52) U.S. Cl.
CPC ...... *G06F 12/0638* (2013.01); *G06F 12/0238* (2013.01); *G06F 12/0246* (2013.01); *G11C 7/1072* (2013.01); *G11C 11/40615* (2013.01); *G11C 14/0045* (2013.01); *G06F 2212/1028* (2013.01); *G06F 2212/205* (2013.01); *G06F 2212/7201* (2013.01); *G11C 7/1006* (2013.01);

*Y02B 60/1225* (2013.01); *Y02B 60/1228* (2013.01); *Y02B 60/1235* (2013.01);
(Continued)

(58) Field of Classification Search
CPC ............. G06F 12/0246; G06F 12/0638; G06F 2212/205; G06F 2212/7201; G11C 7/1072; G11C 11/40615; G11C 14/0045
See application file for complete search history.

(56) References Cited

U.S. PATENT DOCUMENTS 5,735,697 A 4/1998 Muzslay
6,735,697 B1 5/2004 Buhr
(Continued)

FOREIGN PATENT DOCUMENTS

EP 1494242 1/2005
EP 1494242 B1 1/2007

OTHER PUBLICATIONS

PCT Application No. PCT/US2015/062350; filed Nov. 24, 2015; Intel Corporation; International Search Report dated Mar. 31, 2016.
(Continued)

*Primary Examiner* — Shawn X Gu
(74) *Attorney, Agent, or Firm* — Compass IP Law PC

(57) ABSTRACT

Apparatus, systems, and methods to implement polarity based data transfer function for volatile memory power reduction are described. The transfer function take into account certain data values, all zeroes in particular, that are common and transforms them to predetermined values that consume less power and are less common. Similarly, these predetermined values are transformed to the common values.

20 Claims, 14 Drawing Sheets

(51) Int. Cl.
  *G06F 12/02* (2006.01)
  *G11C 7/10* (2006.01)
  *G11C 11/406* (2006.01)
  *G11C 14/00* (2006.01)

(52) U.S. Cl.
  CPC .............. *Y02D 10/13* (2018.01); *Y02D 10/14* (2018.01); *Y02D 10/151* (2018.01)

(56) References Cited

U.S. PATENT DOCUMENTS

| | | | |
|---|---|---|---|
| 7,656,707 B2 | 2/2010 | Kozlov | |
| 2003/0009617 A1* | 1/2003 | Cohen | G06F 1/32 711/105 |
| 2008/0247257 A1* | 10/2008 | Brown | G11C 7/1006 365/227 |
| 2009/0043944 A1 | 2/2009 | Chainer | |
| 2009/0150596 A1 | 6/2009 | Cheng | |

OTHER PUBLICATIONS

Final Office Action for U.S. Appl. No. 14/582,546, dated Dec. 1, 2016, 10 pages.
Notice of Allowance for U.S. Appl. No. 14/582,546, dated Apr. 14, 2017, 11 pages.
Office Action for U.S. Appl. No. 14/582,546, dated May 26, 2016, 18 pages.
PCT Application No. PCT/US2015/062350; Filing date Nov. 24, 2015; Intel Corporation; International Search Report dated Mar. 31, 2016.
Taiwanese and English Translation of Notice of Allowance of R.O.C. For Patent Application No. 104138740, dated Aug. 29, 2017, 3 pages.
Taiwanese and English Translation of Search Report of R.O.C. For Patent Application No. 104138740, dated Dec. 5, 2016, 2 pages.

* cited by examiner

POLARITY BASED DATA TRANSFER FUNCTION FOR VOLATILE MEMORY

CROSS-REFERENCE TO RELATED APPLICATIONS

This application is a continuation of U.S. patent application Ser. No. 14/582,546, filed on Dec. 24, 2014, now issuing as U.S. Pat. No. 9,740,610, which is incorporated herein by reference in its entirety.

FIELD

The present disclosure generally relates to the field of electronics. More particularly, aspects generally relate to a polarity based data transfer function for volatile memory.

BACKGROUND

Volatile memory devices such as such as Dual Data Rate (DDR) Synchronous Dynamic Random Access Memory (DDR SDRAM) exhibit asymmetric power consumption when data value is logic zero, as opposed to a logic one. More particularly, most DDR SDRAM memory consumes different power values when writing, reading, refreshing, activating and pre-charging a logic one (1) in memory than logic zero (0). Accordingly, techniques to manage volatile memory devices may find utility, e.g., in memory systems for electronic devices.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various examples. However, various examples may be practiced without the specific details. In other instances, well-known methods, procedures, components, and circuits have not been described in detail so as not to obscure the particular examples. Further, various aspects of examples may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

As described above, techniques to manage volatile and non-volatile memory devices which take advantage of the power savings resulting associated with writing logic ones (1) over logic zero (0) (or vice versa) may find utility, e.g., in memory systems for electronic devices. The subject matter described herein addresses these and other issues by providing a memory controller with logic that applies a transfer function to write data. As all logic 0 data in registers in the CPU is common, in some examples, the transfer function replaces write data units which are populated entirely with logic zero (0) with either a predetermined number that includes a large number of logic ones (1) or is composed entirely of logic ones (1), thereby reducing the power consumed by the nonvolatile memory to write and store the data in memory. Subsequently, when the data unit is read from memory an inverse transfer function is applied to the data in order to restore the data to its original format before returning the data to a requestor. Further details will be described with reference to FIGS. 1-10, below.

Figure 1:
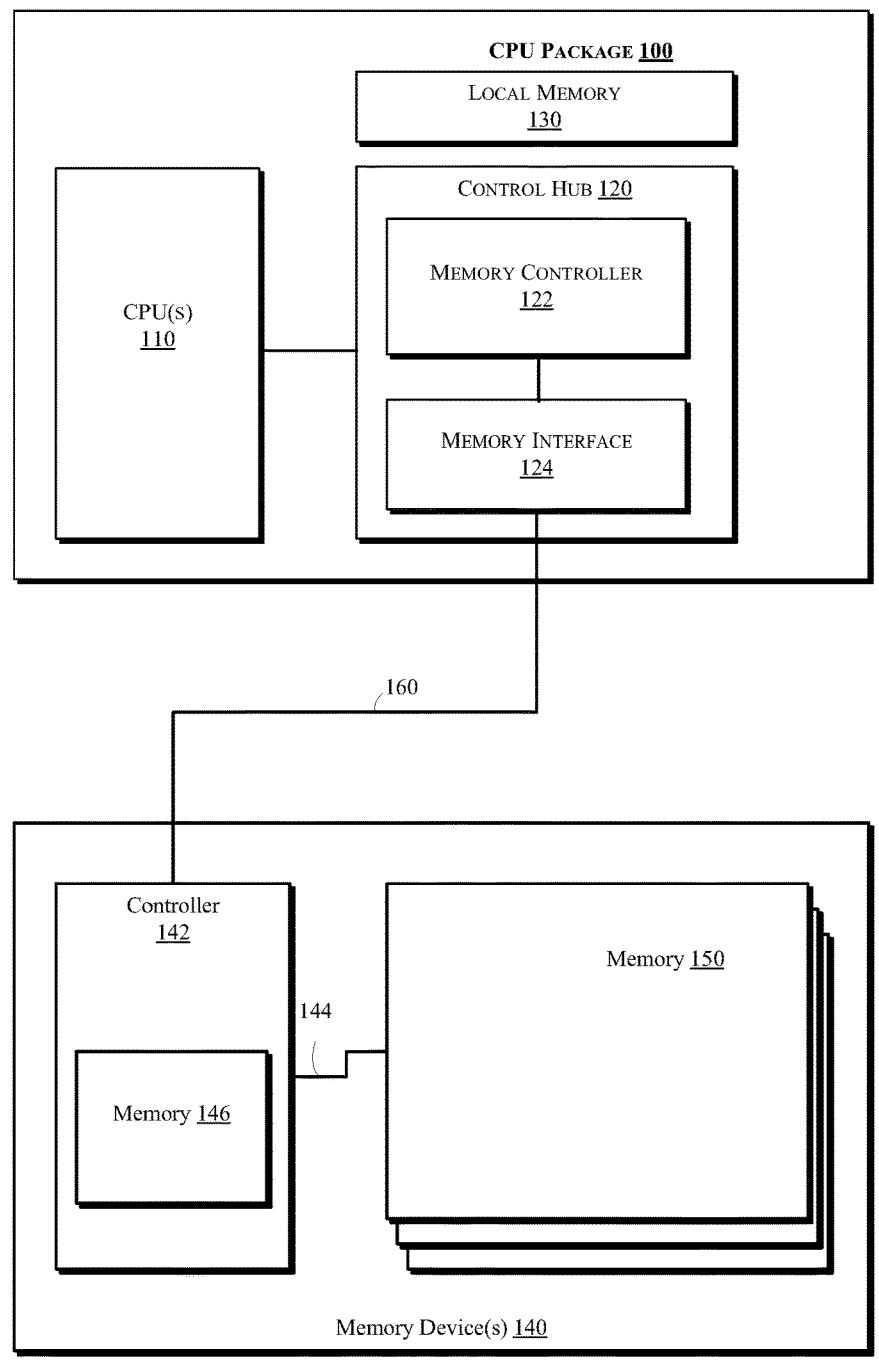
FIG. 1 is a schematic, block diagram illustration of components of an apparatus in which a polarity based data transfer function for volatile memory may be implemented in accordance with various examples discussed herein.

FIG. 1 is a schematic, block diagram illustration of components of an apparatus in which a polarity based data transfer function for volatile memory may be implemented in accordance with various examples discussed herein. Referring to FIG. 1, in some examples a central processing unit (CPU) package 100 which may comprise one or more CPUs 110 coupled to a control hub 120 and a local memory 130. Control hub 120 comprises a memory controller 122 and a memory interface 124. In some examples the control hub 120 may be integrated with the processor(s) 110.

Memory interface 124 is coupled to one or more remote memory devices 140 by a communication bus 160. Memory device 140 may be implemented as a solid state drive (SSD), a nonvolatile direct in-line memory module (NV-DIMM) or the like and comprise a controller 142 which may comprise local memory 146, and memory 150. In various examples, at least some of the memory 150 may comprise nonvolatile memory, e.g., phase change memory, NAND (flash) memory, ferroelectric random-access memory (FeTRAM), nanowire-based non-volatile memory, memory that incorporates memristor technology, a static random access memory (SRAM), three dimensional (3D) cross point memory such as phase change memory (PCM), spin-transfer torque memory (STT-RAM) or NAND memory. The specific configuration of the memory 150 in the memory device(s) 140 is not critical. In such embodiments the memory interface may comprise a Serial ATA interface, a PCI Express (PCIE) interface to CPU package 100, or the like.

In some examples described herein the logic to implement a transfer function may be implemented in the memory controller 122, although in other examples the logic could be implemented one or more of the CPUs 110 or the controller 142. The specific location of the logic is not critical.

Figure 2A:
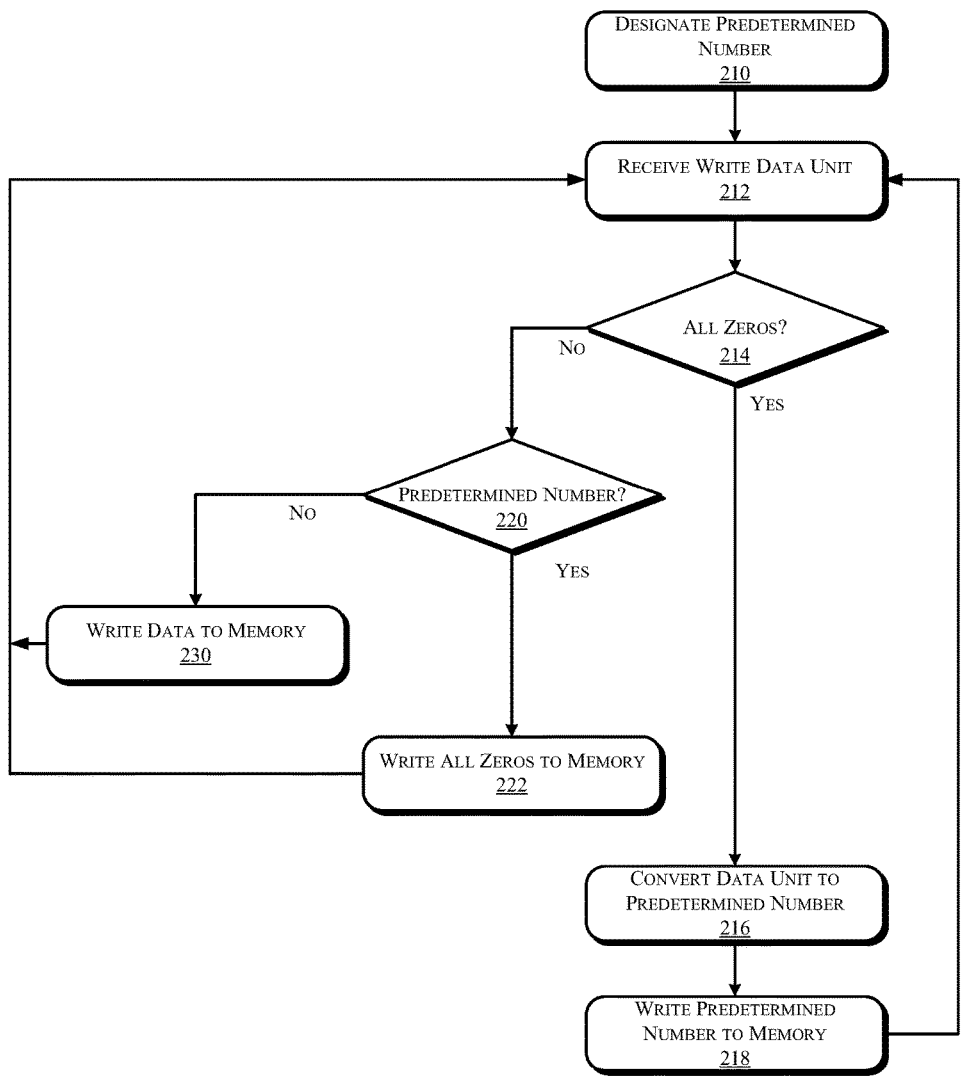
FIG. 2A is a flowchart illustrating high-level operations in methods to implement a write operation for a polarity based data transfer function for volatile memory power reduction in accordance with various examples discussed herein.

A first example of operations to implement a polarity based transfer function will be described with reference to FIGS. 2A and 2B, assuming logic ones (1) has better power saving. Referring first to FIG. 2A, at operation 210 the memory controller 122 designates a predetermined number to which data units composed entirely of logic zeroes (0) will be converted. In some examples the predetermined number may be selected as a number with a number of logic ones (1). For example, for a 16 bit data unit the predetermined number may be designated as 0x_7FFF in hex (0111 1111 1111 1111 in binary). The specific predetermined number is not critical but it should contain high number of logic ones (1) for power saving.

At operation 212 a write data unit is received in the controller 122. For example, controller 122 may receive a write operation including a write data unit from a host device such as an application executing on one or more of the CPUs 110.

If, at operation 214, the write data unit is composed of all logic zeros (0) then control passes to operation 216 and the memory controller 122 converts the data unit to the predetermined number designated in operation 210. Thus, a 16 bit data unit that arrives in controller 122 as all zeros (0000 0000 0000 0000) is converted to a transformed 16 bit data unit of (0111 1111 1111 1111). At operation 218 the transformed data unit comprising the predetermined number is written to memory 150.

By contrast, if at operation 214 the write data unit does not comprise all zeros then control passes to operation 220 and the memory controller 122 determines whether the data unit received in operation 212 comprises the predetermined number designated in operation 210. If, at operation 220 the data unit received in operation 212 comprises the predetermined number designated in operation 210 then control passes to operation 222 and the memory controller 122 writes a data unit comprising all logic zeros (0) to memory. Applying this rule to the specific numeric examples herein, if the write data unit is (0111 1111 1111 1111) then the controller 122 writes (0000 0000 0000 0000) to memory 150.

By contrast, if at operation 220 the write data unit received in operation 212 does not comprise the predetermined number designated in operation 210 then control passes to operation 230 and the controller 122 writes the data received in the data unit to memory 150.

Figure 2B:
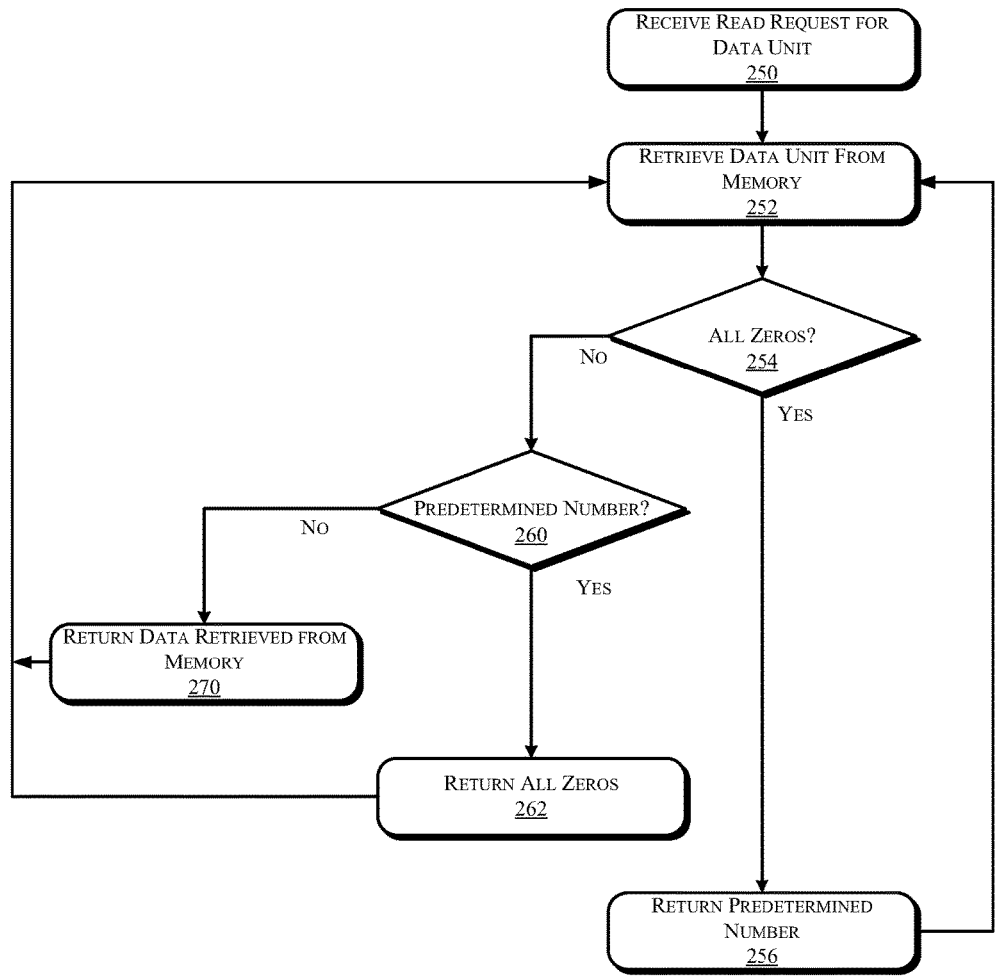
FIG. 2B is a flowchart illustrating high-level operations in methods to implement a read operation for a polarity based data transfer function for volatile memory power reduction in accordance with various examples discussed herein.

FIG. 2B is a flowchart illustrating high-level operations in methods to implement a read operation for a polarity based data transfer function for volatile memory power reduction in accordance with various examples discussed herein. More particularly, the operations depicted in FIG. 2B implement an inverse transfer function when the data unit written to memory in FIG. 2A is read from memory.

Referring to FIG. 2B, at operation 250 the controller 122 receives a read request for the data unit written in FIG. 2A. At operation 252 the controller 122 retrieves the data unit from memory 150. If, at operation 254, the read data unit is composed of all logic zeros (0) then control passes to operation 256 and the memory controller 122 converts the read data unit to the predetermined number designated in operation 210. Thus, a 16 bit data unit that arrives in controller 122 as all zeros (0000 0000 0000 0000) is converted to a transformed 16 bit data unit of (0111 1111 1111 1111) and returned in response to the read request.

By contrast, if at operation 254 the read data unit does not comprise all zeros then control passes to operation 260 and the memory controller 122 determines whether the data unit retrieved in operation 252 comprises the predetermined number designated in operation 210. If, at operation 260 the data unit retrieved in operation 252 comprises the predetermined number designated in operation 210 then control passes to operation 262 and the memory controller 122 returns a data unit comprising all logic zeros (0) in response to the read request. Applying this rule to the specific numeric examples herein, if the write data unit is (0111 1111 1111 1111) then the controller 122 returns (0000 0000 0000 0000) in response to the read request.

By contrast, if at operation 260 the data unit retrieved in operation 252 does not comprise the predetermined number designated in operation 210 then control passes to operation 230 and the controller 122 returns the data retrieved from memory in response to the read request.

Figure 3A:
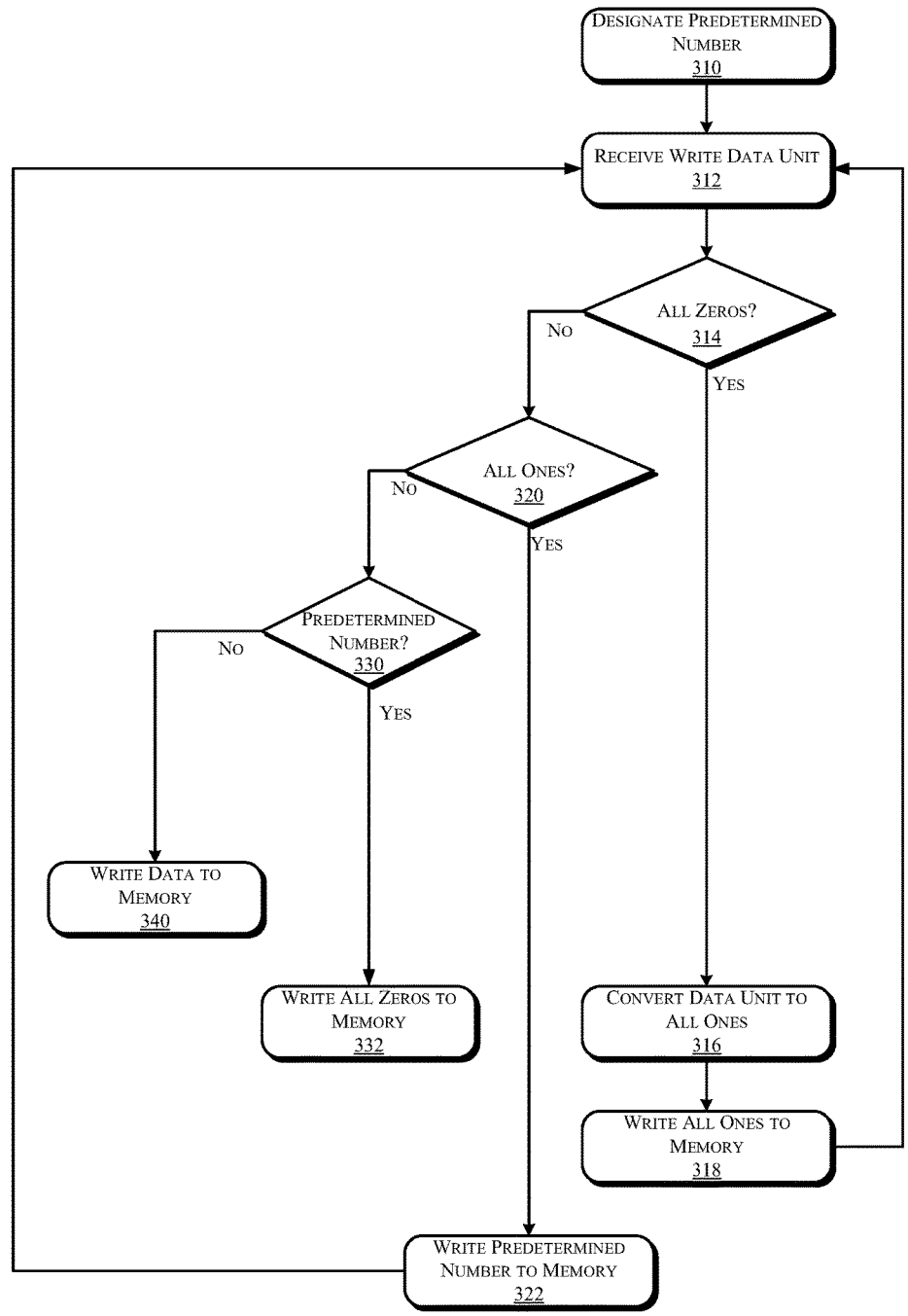
FIG. 3A is a flowchart illustrating high-level operations in methods to implement a write operation for a polarity based data transfer function for volatile memory power reduction in accordance with various examples discussed herein.

A second example of operations to implement a polarity based transfer function will be described with reference to FIGS. 3A and 3B assuming logic ones (1) has better power saving. Referring first to FIG. 3A, at operation 310 the memory controller 122 designates a predetermined number to which data units composed entirely of logic ones (1) will be converted. In some examples the predetermined number may be selected as a number with a number of logic ones (1). For example, for a 16 bit data unit the predetermined number may be designated as 0x_7FFF in hex (0111 1111 1111 1111 in binary). The specific predetermined number is not critical but it should contain high number of logic one (1) for power saving.

At operation 312 a write data unit is received in the controller 122. For example, controller 122 may receive a write operation including a write data unit from a host device such as an application executing on one or more of the CPUs 110.

If, at operation 314, the write data unit is composed of all logic zeros (0) then control passes to operation 316 and the memory controller 122 converts the data unit to all logic ones (1). Thus, a 16 bit data unit that arrives in controller 122 as all zeros (0000 0000 0000 0000) is converted to a transformed 16 bit data unit of (1111 1111 1111 1111). At operation 318 the transformed data unit comprising the predetermined number is written to memory 150.

By contrast, if at operation 314 the write data unit does not comprise all zeros then control passes to operation 320 and the memory controller 122 determines whether the data unit received in operation 312 comprises all ones (1). If, at operation 320 the data unit received in operation 312 comprises all ones (1) then control passes to operation 322 and the memory controller 122 writes a data unit comprising the predetermined number designated in operation 310 to memory 150. Applying this rule to the specific numeric examples herein, if the write data unit is (1111 1111 1111 1111) then the controller 122 writes (0111 1111 1111 1111) to memory 150.

By contrast, if at operation 320 the write data unit received in operation 312 does not comprise all ones (1) then control passes to operation 330, where it is determined whether the write data unit received in operation 312 comprises the predetermined number designated in operation 310. If, at operation 330 the write data unit received in operation 312 comprises the predetermined number designated in operation 310 then control passes to operation 332 and the controller 122 writes all zeros (0) to memory 150.

By contrast, if at operation 330 the write data unit received in operation 312 does not comprise the predetermined number designated in operation 310 then control passes to operation 340, where the controller 122 writes the data received in the data unit to memory 150.

Figure 3B:
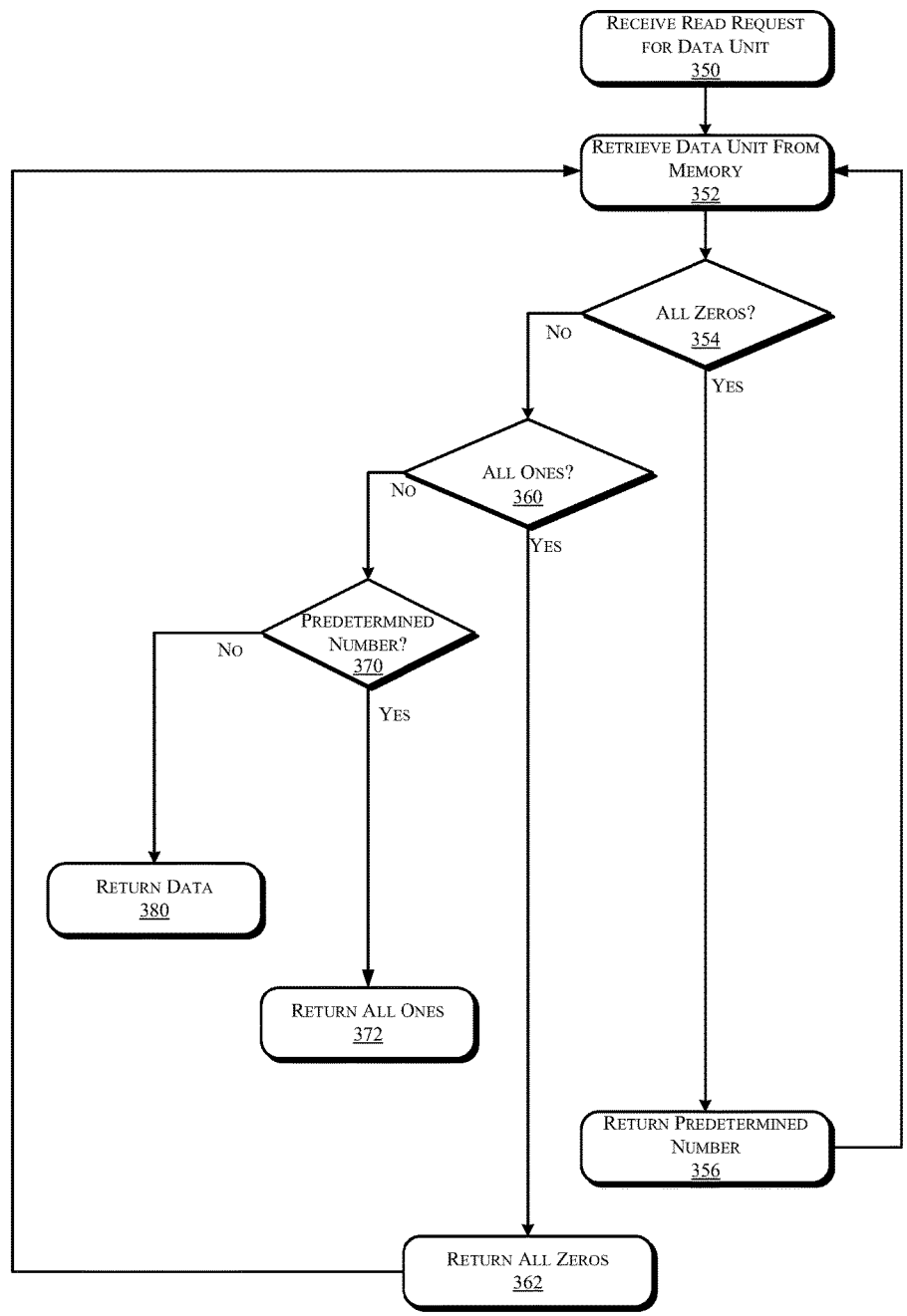
FIG. 3B is a flowchart illustrating high-level operations in methods to implement a read operation for a polarity based data transfer function for volatile memory power reduction in accordance with various examples discussed herein.

FIG. 3B is a flowchart illustrating high-level operations in methods to implement a read operation for a polarity based data transfer function for volatile memory power reduction in accordance with various examples discussed herein. More particularly, the operations depicted in FIG. 3B implement an inverse transfer function when the data unit written to memory in FIG. 3A is read from memory.

Referring to FIG. 3B, at operation 350 the controller 122 receives a read request for the data unit written in FIG. 3A. At operation 352 the controller 122 retrieves the data unit from memory 150. If, at operation 354, the read data unit is composed of all logic zeroes (0) then control passes to operation 356 and the memory controller 122 converts the read data unit to the predetermined number designated in operation 310. Thus, a 16 bit data unit that arrives in controller 122 as all zeroes (0000 0000 0000 0000) is converted to a transformed 16 bit data unit of (0111 1111 1111 1111) and returned in response to the read request.

By contrast, if at operation 354 the write data unit does not comprise all zeroes then control passes to operation 360 and the memory controller 122 determines whether the data unit retrieved in operation 352 comprises all logic ones (1). If, at operation 360 the data unit retrieved in operation 352 comprises the all logic ones (1) then control passes to operation 362 and the memory controller 122 returns a data unit comprising all logic zeroes (0) in response to the read request. Applying this rule to the specific numeric examples herein, if the write data unit is (1111 1111 1111 1111) then the controller 122 returns (0000 0000 0000 0000) in response to the read request.

By contrast, if at operation 360 the write data unit does not comprise all ones then control passes to operation 370 and the memory controller 122 determines whether the data unit retrieved in operation 352 comprises the predetermined number designated in operation 310. If, at operation 370 the data unit retrieved in operation 352 comprises the predetermined number designated in operation 310 then control passes to operation 372 and the memory controller 122 returns a data unit comprising all logic ones (1) in response to the read request. Applying this rule to the specific numeric examples herein, if the write data unit is (0111 1111 1111 1111) then the controller 122 returns (1111 1111 1111 1111) in response to the read request.

By contrast, if at operation 370 the data unit retrieved in operation 352 does not comprise the predetermined number designated in operation 310 then control passes to operation 380 and the controller 122 returns the data retrieved from memory in response to the read request.

As described, the above examples assume logic value of one (1) to consume less power than logic power of zero (0) and are given with a transfer function that converts data units which have all logic zeroes (0), which is a common number, to a data unit which has a high number (or all) logic ones (1) in order to reduce power consumption by the memory. Subsequent read operations then apply an inverse transfer function to revert the data back to its original form.

One skilled in the art will understand that some of the memory 150 on memory devices 140 may be configured such that a logic "0" is a low-energy value, rather than a logic "1" as described herein. In such examples an inverter may be applied to invert the output of the transfer function, e.g., by converting a data unit which has a high number (or all) logic ones (1) to a data word that has a high number (or all) logic zeroes (0). It is common in some memory devices as DRAMs that certain addresses space will favor zeroes (0) while other will favor ones (1)h For example, a vendor of a memory device 140 may provide information such as address ranges, etc., of the portions of memory 150 which have a logic zero (0) as the low energy state. This information may be configured in the memory controller 122. When an electronic device which is coupled to the memory device 140 is booted, the basic input/output system (BIOS) of the electronic device may gather the relevant address range(s) from the memory device and provide the address range(s) to the transfer function logic. The transfer function logic may then apply an inverter to the output of the transfer function for the relevant address range(s).

Figure 4A:
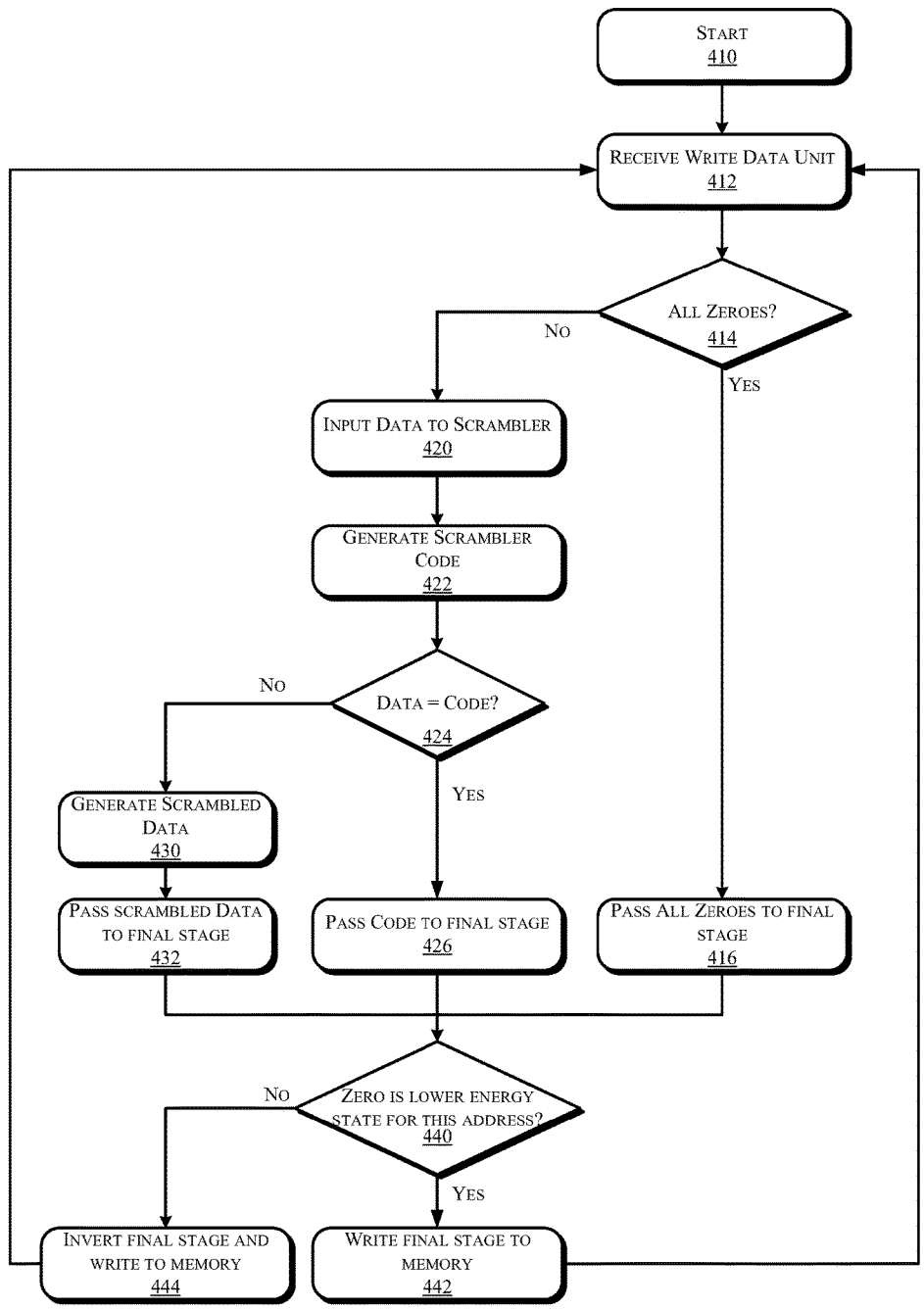
FIG. 4A is a flowchart illustrating high-level operations in methods to implement a write operation for a polarity based data transfer function for volatile memory power reduction in accordance with various examples discussed herein.

A third example of operations to implement a polarity based transfer function will be described with reference to FIGS. 4A and 4B and FIGS. 5A-5B. In the third example the transfer function incorporates a data scrambler. FIG. 5A illustrates the logic in memory controller 122 arranged for a write data path. Referring briefly to FIG. 5A, the logic in the memory controller 122 may comprise a zero detector 510, a scramble code generator 515, a detector 520 to determine whether the data received is equal to a code generated by the scramble code generator 515, an XOR operator to form scrambled data from data and code 525, a multiplexor 530 to select between the various data conditions, an inverter 535, and a multiplexor 540 to select if to invert the data based on power. FIG. 5B illustrates the logic in memory controller arranged for a read data path.

Operation of the logic will be described with reference to FIGS. 4A and 4B. Referring first to FIG. 4A, the method starts at operation 410 and at operation 412 a write data unit is received in the controller 122. For example, controller 122 may receive a write operation including a write data unit from a host device such as an application executing on one or more of the CPUs 110.

If, at operation 414, the write data unit is composed of all logic zeroes (0) then control passes to operation 416 and the logic pass all zeroes to the final stage. Based on vendor information for the memory 140 in the system, operation 440 determines whether logic zero is the lower energy state in this address space. If zero is the lower state, the control passes to write the final stage to memory 442. In this case this means all zeroes. If zero is not the lower energy state, the control passes to invert final stage and write to memory 444. In this case, this means all ones is sent to memory 140. Thus, a 16 bit data unit that arrives in controller 122 as all zeroes (0000 0000 0000 0000) is converted to a transformed 16 bit data unit of (1111 1111 1111 1111). Referring briefly to FIG. 5, if the zero detector 510 detects that the data input is all zeroes then all zeroes is forwarded by the multiplexor 530. If zeroes is not the lower energy state, Inverter 535 inverts the data which is input to multiplexor 540.

By contrast, if at operation 414 the write data unit does not comprise all zeroes then control passes to operation 420 and the memory controller 122 inputs the data to the scrambler. At operation 422 the scramble code generator 515 generates a scramble code. At operation 424 the detector 520 determines whether the data received at operation 412 equals the scramble code. If, at operation 424 the data received at operation 412 equals the scramble code then control passes to operation 426 and the controller 122 writes the scramble code to the final stage. Based on the condition 440, if zero is the lower power state, the control passes to operation 442 and the controller 122 writes the final stage to memory. In this case, the scrambler code generated at operation 422 is written to memory. By contrast, if at operation 440 zero is not the lower power state, then control passes to operation 444 and the controller 122 inverts the final stage and write to memory 444. In this case, this means scrambler code generated at operation 422 is inverted before sent to memory 140.

By contrast, if at operation 424 the data received at operation 412 does not equal the scramble code then control passes to operation 430 and the controller 122 generates scrambled data and at operation 432 the controller passes scrambled data to final stage. Based on the condition 440, if zero is the lower power state, the control passes to write the final stage to memory 442. In this case, this means scrambled data. By contrast, if zero is not the lower power state, the control passes to invert final stage and write to memory 444. In this case, this means scrambled data is inverted before sent to memory.

Figure 4B:
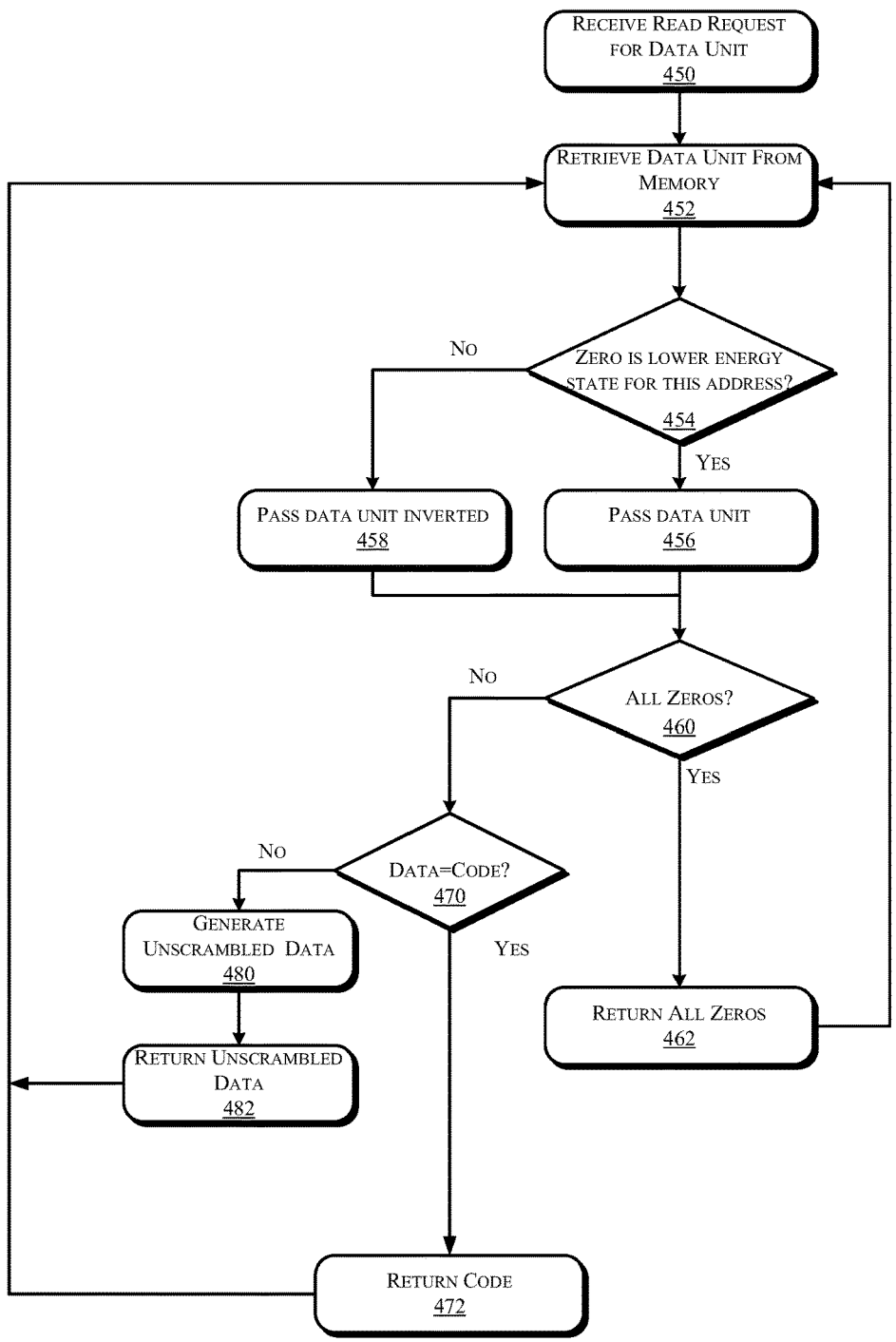
FIG. 4B is a flowchart illustrating high-level operations in methods to implement a read operation for a polarity based data transfer function for volatile memory power reduction in accordance with various examples discussed herein.
Figure 5A:
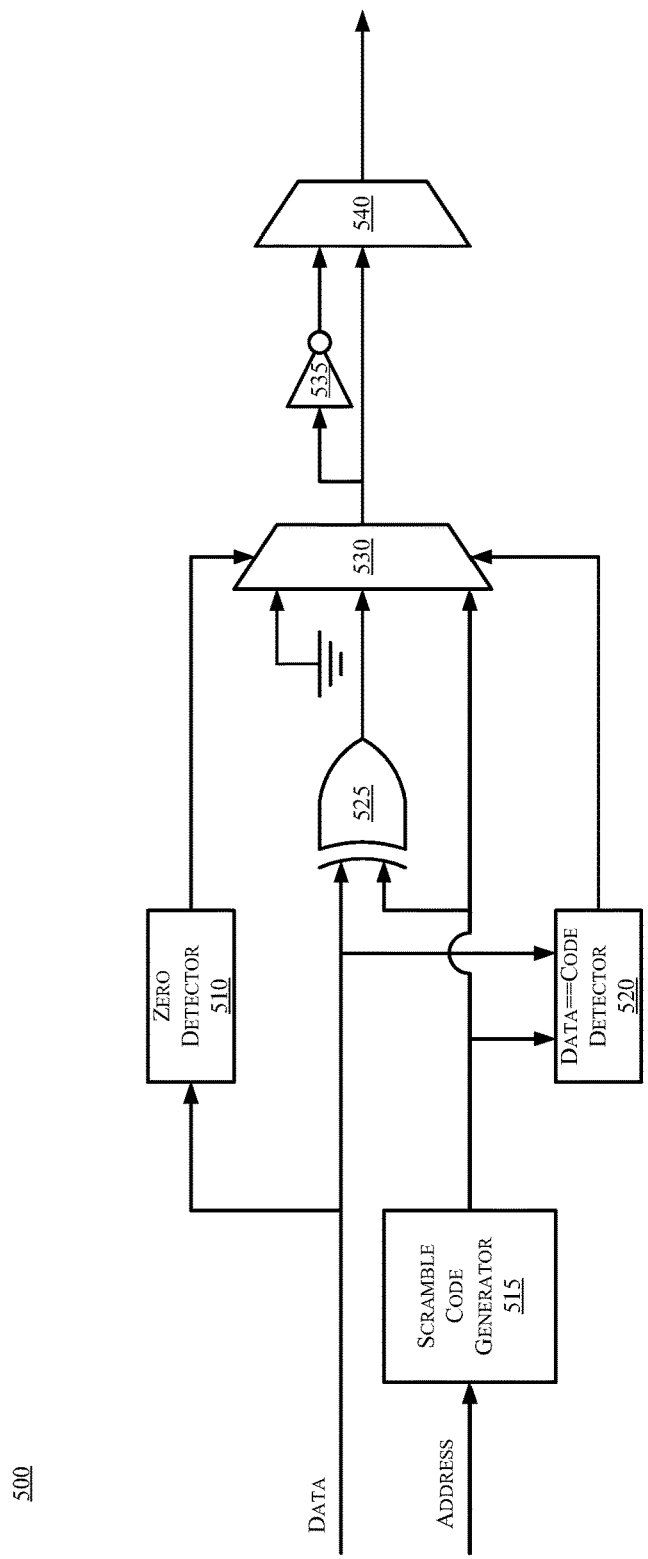
FIGS. 5A-5B is a schematic illustration of logic components to implement a write operation for a polarity based data transfer function for volatile memory power reduction in accordance with various examples discussed herein.
Figure 5B:
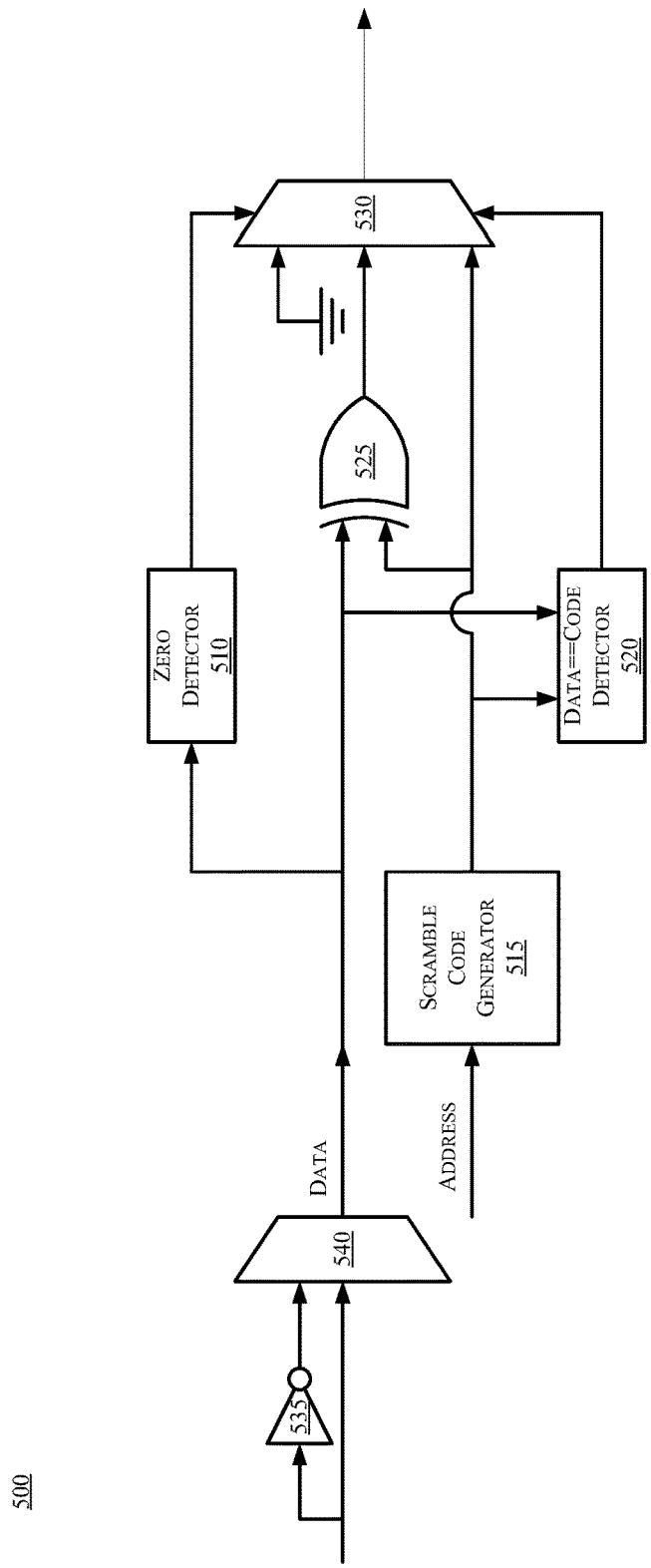

FIG. 4B is a flowchart illustrating high-level operations in methods to implement a read operation for a polarity based data transfer function for memory power reduction in accordance with various examples discussed herein. More particularly, the operations depicted in FIG. 4B implement an inverse transfer function when the data unit written to memory in FIG. 4A is read from memory.

Referring to FIG. 4B, at operation 450 the controller 122 receives a read request for the data unit written in FIG. 4A. At operation 452 the controller 122 retrieves the data unit from memory 150. For example, based on vendor information for the memory 140 in the system, operation 454 determines whether logic zero is the lower energy state of this address. If, at operation 454, zero is the lower energy state, then control passes the data unit to the next stage at operation 456. By contrast, if at operation 454 zero is not the lower energy state, then control passes to operation 458 to invert the data unit before it is passed to the next stage. The result of operation 456 or 458 is passed to the zero detector at operation 460. If, at operation 460, the read data unit is composed of all logic zeroes (0) then control passes to operation 462 and the memory controller 122 converts the read data unit to all logic zeroes (0). Thus, a 16 bit data unit that arrives in controller 122 as all ones (1111 1111 1111 1111) and zero is not the lower energy figure, is converted to a transformed 16 bit data unit of (0000 0000 0000 0000) and returned in response to the read request.

By contrast, if at operation 460 the write data unit does not comprise all zeroes then control passes to operation 470 and the memory controller 122 determines whether the data unit retrieved in operation 452 is equal to the scramble code generated by the scramble code generator 515 in operation 422. If, at operation 470 the data equals the scrambler code then control passes to operation 472 and the memory controller 122 returns a data unit comprising the scramble code generated by the scramble code generator 515 in operation 422 in response to the read request.

By contrast, if at operation 470 the data is not equals the scrambler code then control passes to operation 480 and the memory controller 122 generates an unscrambled data unit and at operation 482 the controller 122 returns the data retrieved from memory in response to the read request.

Figure 6:
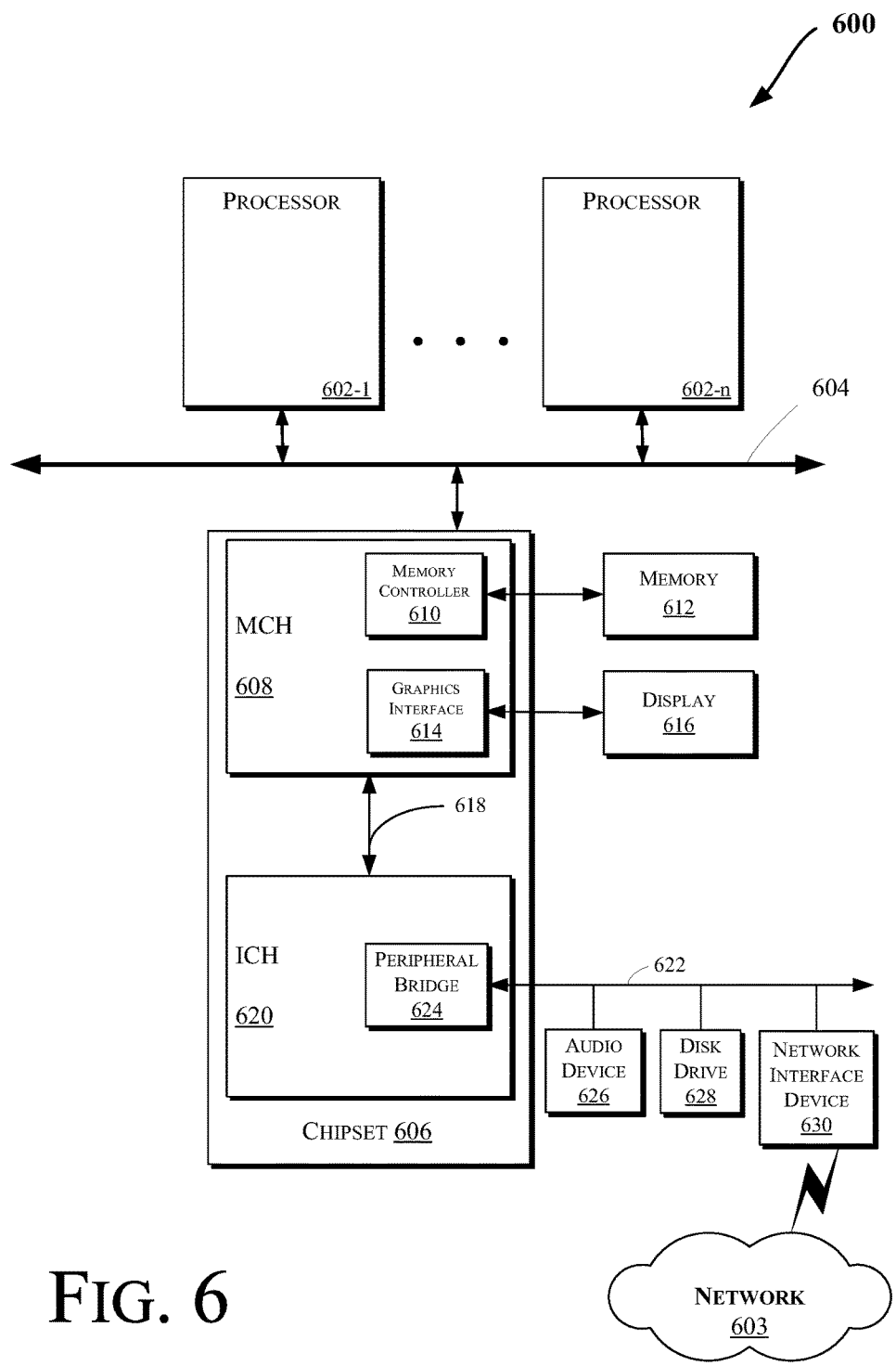
FIGS. 6-10 are schematic, block diagram illustrations of electronic devices which may be adapted to implement polarity based data transfer function for volatile memory power reduction in accordance with various examples discussed herein.

As described above, in some examples the electronic device may be embodied as a computer system. FIG. 6 illustrates a block diagram of a computing system 600 in accordance with an example. The computing system 600 may include one or more central processing unit(s) (CPUs) 602 or processors that communicate via an interconnection network (or bus) 604. The processors 602 may include a general purpose processor, a network processor (that processes data communicated over a computer network 603), or other types of a processor (including a reduced instruction set computer (RISC) processor or a complex instruction set computer (CISC)). Moreover, the processors 602 may have a single or multiple core design. The processors 602 with a multiple core design may integrate different types of processor cores on the same integrated circuit (IC) die. Also, the processors 602 with a multiple core design may be implemented as symmetrical or asymmetrical multiprocessors. In an example, one or more of the processors 602 may be the same or similar to the processors 102 of FIG. 1. For example, one or more of the processors 602 may include the control unit 120 discussed with reference to FIGS. 1-3. Also, the operations discussed with reference to FIGS. 3-5 may be performed by one or more components of the system 600.

A chipset 606 may also communicate with the interconnection network 604. The chipset 606 may include a memory control hub (MCH) 608. The MCH 608 may include a memory controller 610 that communicates with a memory 612 (which may be the same or similar to the memory 130 of FIG. 1). The memory 412 may store data, including sequences of instructions, that may be executed by the CPU 602, or any other device included in the computing system 600. In one example, the memory 612 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 604, such as multiple CPUs and/or multiple system memories.

The MCH 608 may also include a graphics interface 614 that communicates with a display device 616. In one example, the graphics interface 614 may communicate with the display device 616 via an accelerated graphics port (AGP). In an example, the display 616 (such as a flat panel display) may communicate with the graphics interface 614 through, for example, a signal converter that translates a digital representation of an image stored in a storage device such as video memory or system memory into display signals that are interpreted and displayed by the display 616. The display signals produced by the display device may pass through various control devices before being interpreted by and subsequently displayed on the display 616.

A hub interface 618 may allow the MCH 608 and an input/output control hub (ICH) 620 to communicate. The ICH 620 may provide an interface to I/O device(s) that communicate with the computing system 600. The ICH 620 may communicate with a bus 622 through a peripheral bridge (or controller) 624, such as a peripheral component interconnect (PCI) bridge, a universal serial bus (USB) controller, or other types of peripheral bridges or controllers. The bridge 624 may provide a data path between the CPU 602 and peripheral devices. Other types of topologies may be utilized. Also, multiple buses may communicate with the ICH 620, e.g., through multiple bridges or controllers. Moreover, other peripherals in communication with the ICH 620 may include, in various examples, integrated drive electronics (IDE) or small computer system interface (SCSI)

hard drive(s), USB port(s), a keyboard, a mouse, parallel port(s), serial port(s), floppy disk drive(s), digital output support (e.g., digital video interface (DVI)), or other devices.

The bus 622 may communicate with an audio device 626, one or more disk drive(s) 628, and a network interface device 630 (which is in communication with the computer network 603). Other devices may communicate via the bus 622. Also, various components (such as the network interface device 630) may communicate with the MCH 608 in some examples. In addition, the processor 602 and one or more other components discussed herein may be combined to form a single chip (e.g., to provide a System on Chip (SOC)). Furthermore, the graphics accelerator 616 may be included within the MCH 608 in other examples.

Furthermore, the computing system 600 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 628), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 7:
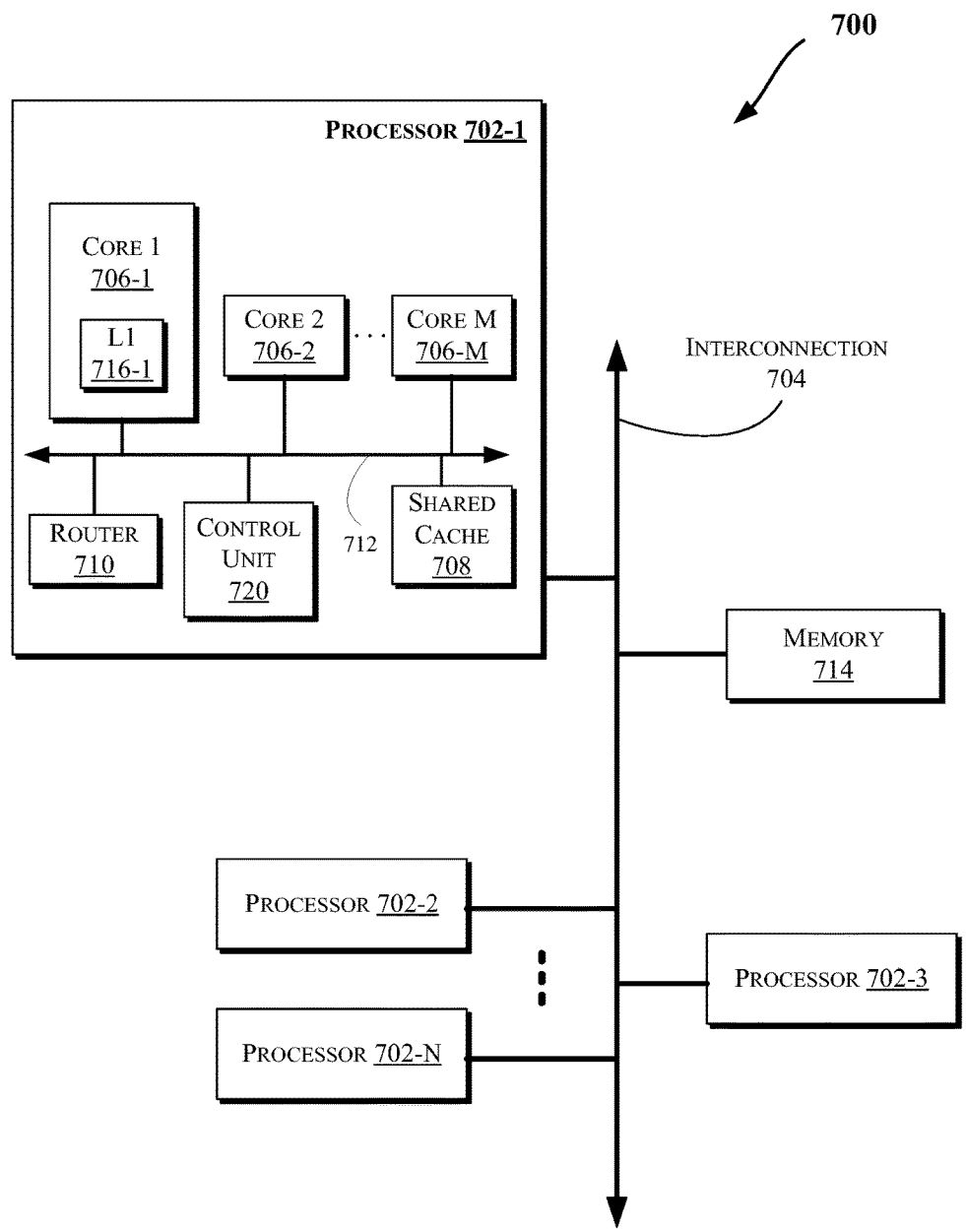

FIG. 7 illustrates a block diagram of a computing system 700, according to an example. The system 700 may include one or more processors 702-1 through 702-N (generally referred to herein as "processors 702" or "processor 702"). The processors 702 may communicate via an interconnection network or bus 704. Each processor may include various components some of which are only discussed with reference to processor 702-1 for clarity. Accordingly, each of the remaining processors 702-2 through 702-N may include the same or similar components discussed with reference to the processor 702-1.

In an example, the processor 702-1 may include one or more processor cores 706-1 through 706-M (referred to herein as "cores 706" or more generally as "core 706"), a shared cache 708, a router 710, and/or a processor control logic or unit 720. The processor cores 706 may be implemented on a single integrated circuit (IC) chip. Moreover, the chip may include one or more shared and/or private caches (such as cache 708), buses or interconnections (such as a bus or interconnection network 712), memory controllers, or other components.

In one example, the router 710 may be used to communicate between various components of the processor 702-1 and/or system 700. Moreover, the processor 702-1 may include more than one router 710. Furthermore, the multitude of routers 710 may be in communication to enable data routing between various components inside or outside of the processor 702-1.

The shared cache 708 may store data (e.g., including instructions) that are utilized by one or more components of the processor 702-1, such as the cores 706. For example, the shared cache 708 may locally cache data stored in a memory 714 for faster access by components of the processor 702. In an example, the cache 708 may include a mid-level cache (such as a level 2 (L2), a level 3 (L3), a level 4 (L4), or other levels of cache), a last level cache (LLC), and/or combinations thereof. Moreover, various components of the processor 702-1 may communicate with the shared cache 708 directly, through a bus (e.g., the bus 712), and/or a memory controller or hub. As shown in FIG. 7, in some examples, one or more of the cores 706 may include a level 1 (L1) cache 716-1 (generally referred to herein as "L1 cache 716"). In one example, the control unit 720 may include logic to implement the operations described above with reference to the memory controller 122 in FIG. 2.

Figure 8:
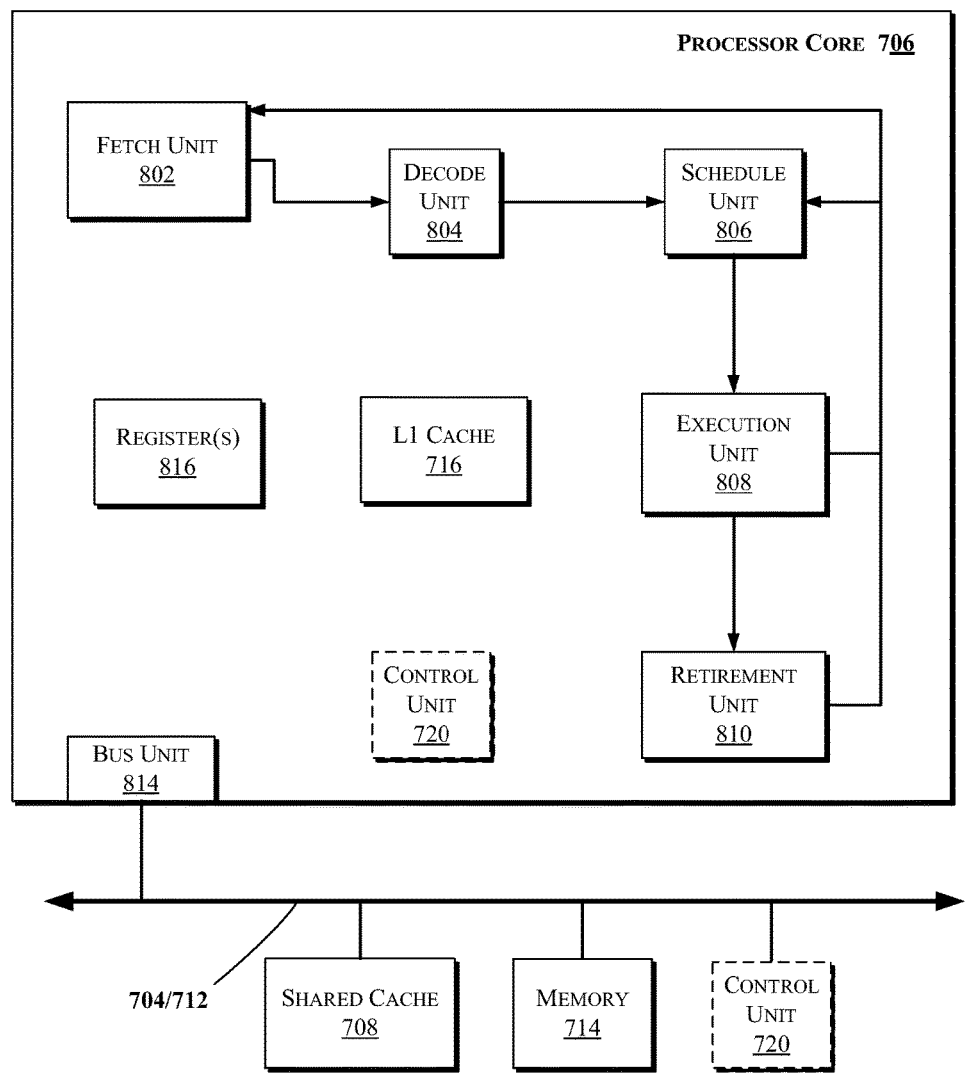

FIG. 8 illustrates a block diagram of portions of a processor core 706 and other components of a computing system, according to an example. In one example, the arrows shown in FIG. 8 illustrate the flow direction of instructions through the core 706. One or more processor cores (such as the processor core 706) may be implemented on a single integrated circuit chip (or die) such as discussed with reference to FIG. 7. Moreover, the chip may include one or more shared and/or private caches (e.g., cache 708 of FIG. 7), interconnections (e.g., interconnections 704 and/or 112 of FIG. 7), control units, memory controllers, or other components.

As illustrated in FIG. 8, the processor core 706 may include a fetch unit 802 to fetch instructions (including instructions with conditional branches) for execution by the core 706. The instructions may be fetched from any storage devices such as the memory 714. The core 706 may also include a decode unit 804 to decode the fetched instruction. For instance, the decode unit 804 may decode the fetched instruction into a plurality of uops (micro-operations).

Additionally, the core 706 may include a schedule unit 806. The schedule unit 806 may perform various operations associated with storing decoded instructions (e.g., received from the decode unit 804) until the instructions are ready for dispatch, e.g., until all source values of a decoded instruction become available. In one example, the schedule unit 806 may schedule and/or issue (or dispatch) decoded instructions to an execution unit 808 for execution. The execution unit 808 may execute the dispatched instructions after they are decoded (e.g., by the decode unit 804) and dispatched (e.g., by the schedule unit 806). In an example, the execution unit 808 may include more than one execution unit. The execution unit 808 may also perform various arithmetic operations such as addition, subtraction, multiplication, and/or division, and may include one or more an arithmetic logic units (ALUs). In an example, a co-processor (not shown) may perform various arithmetic operations in conjunction with the execution unit 808.

Further, the execution unit 808 may execute instructions out-of-order. Hence, the processor core 706 may be an out-of-order processor core in one example. The core 706 may also include a retirement unit 810. The retirement unit 810 may retire executed instructions after they are committed. In an example, retirement of the executed instructions may result in processor state being committed from the execution of the instructions, physical registers used by the instructions being de-allocated, etc.

The core 706 may also include a bus unit 714 to enable communication between components of the processor core 706 and other components (such as the components discussed with reference to FIG. 8) via one or more buses (e.g., buses 804 and/or 812). The core 706 may also include one or more registers 816 to store data accessed by various components of the core 706 (such as values related to power consumption state settings).

Furthermore, even though FIG. 7 illustrates the control unit 720 to be coupled to the core 706 via interconnect 812, in various examples the control unit 720 may be located elsewhere such as inside the core 706, coupled to the core via bus 704, etc.

Figure 9:
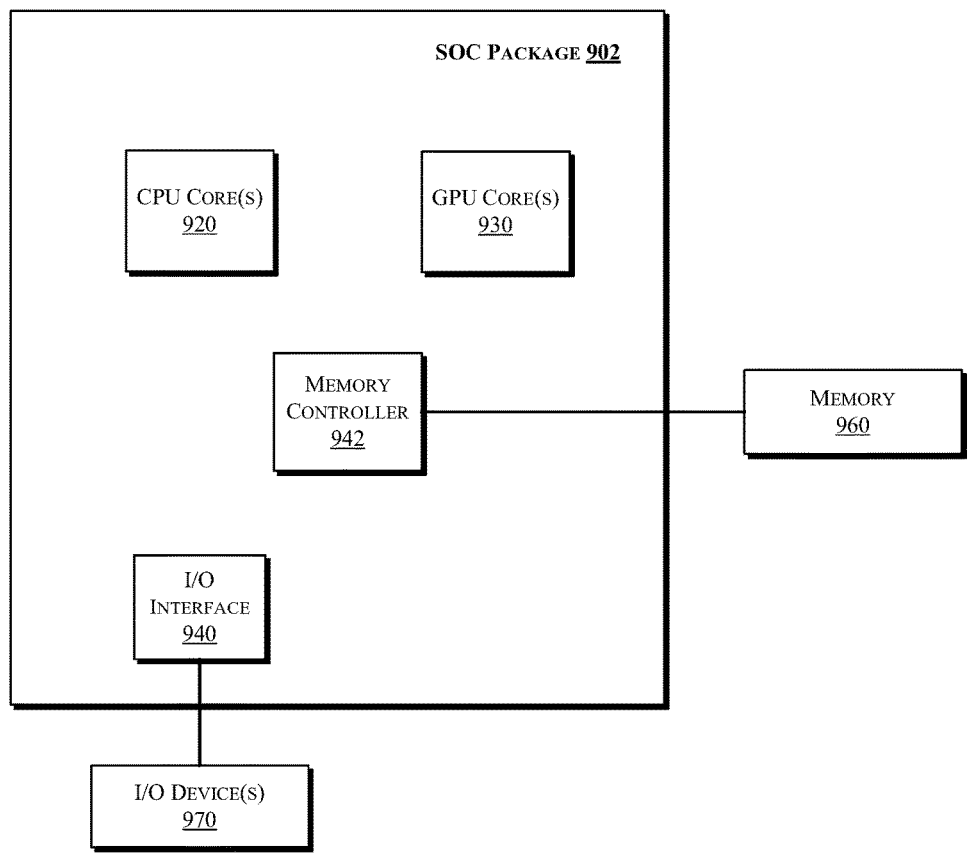

In some examples, one or more of the components discussed herein can be embodied as a System On Chip (SOC) device. FIG. 9 illustrates a block diagram of an SOC package in accordance with an example. As illustrated in FIG. 9, SOC 902 includes one or more Central Processing Unit (CPU) cores 920, one or more Graphics Processor Unit (GPU) cores 930, an Input/Output (I/O) interface 940, and a memory controller 942. Various components of the SOC package 902 may be coupled to an interconnect or bus such as discussed herein with reference to the other figures. Also, the SOC package 902 may include more or less components, such as those discussed herein with reference to the other figures. Further, each component of the SOC package 902 may include one or more other components, e.g., as discussed with reference to the other figures herein. In one example, SOC package 902 (and its components) is provided on one or more Integrated Circuit (IC) die, e.g., which are packaged into a single semiconductor device.

As illustrated in FIG. 9, SOC package 902 is coupled to a memory 960 (which may be similar to or the same as memory discussed herein with reference to the other figures) via the memory controller 942. In an example, the memory 960 (or a portion of it) can be integrated on the SOC package 902.

The I/O interface 940 may be coupled to one or more I/O devices 970, e.g., via an interconnect and/or bus such as discussed herein with reference to other figures. I/O device(s) 970 may include one or more of a keyboard, a mouse, a touchpad, a display, an image/video capture device (such as a camera or camcorder/video recorder), a touch screen, a speaker, or the like.

Figure 10:
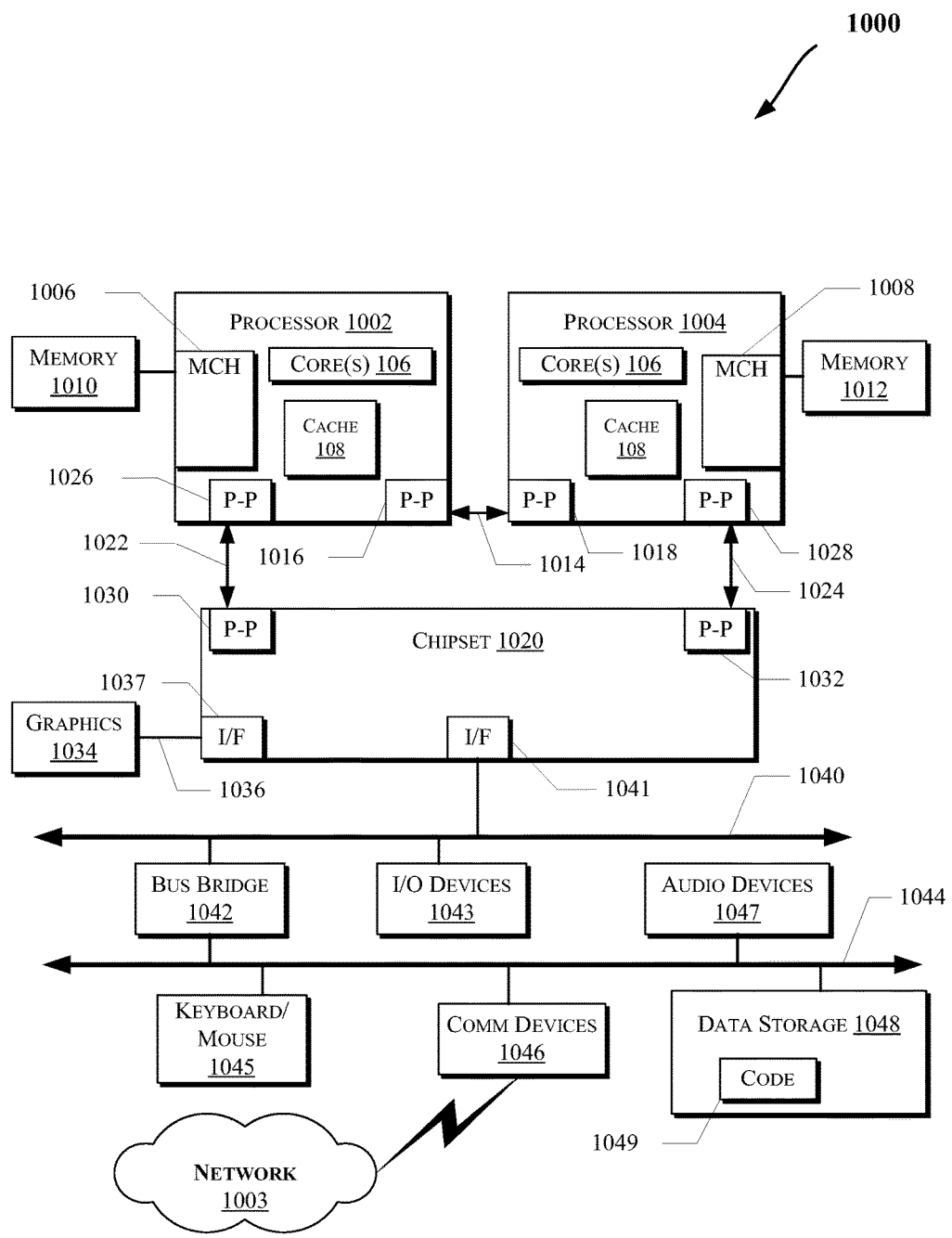

FIG. 10 illustrates a computing system 1000 that is arranged in a point-to-point (PtP) configuration, according to an example. In particular, FIG. 10 shows a system where processors, memory, and input/output devices are interconnected by a number of point-to-point interfaces. The operations discussed with reference to FIG. 2 may be performed by one or more components of the system 1000.

As illustrated in FIG. 10, the system 1000 may include several processors, of which only two, processors 1002 and 1004 are shown for clarity. The processors 1002 and 1004 may each include a local memory controller hub (MCH) 1006 and 1008 to enable communication with memories 1010 and 1012. MCH 1006 and 1008 may include the memory controller 120 and/or logic of FIG. 1 in some examples.

In an example, the processors 1002 and 1004 may be one of the processors 702 discussed with reference to FIG. 7. The processors 1002 and 1004 may exchange data via a point-to-point (PtP) interface 1014 using PtP interface circuits 1016 and 1018, respectively. Also, the processors 1002 and 1004 may each exchange data with a chipset 1020 via individual PtP interfaces 1022 and 1024 using point-to-point interface circuits 1026, 1028, 1030, and 1032. The chipset 1020 may further exchange data with a high-performance graphics circuit 1034 via a high-performance graphics interface 1036, e.g., using a PtP interface circuit 1037.

As shown in FIG. 10, one or more of the cores 106 and/or cache 108 of FIG. 1 may be located within the processors 1002 and 1004. Other examples, however, may exist in other circuits, logic units, or devices within the system 1000 of FIG. 10. Furthermore, other examples may be distributed throughout several circuits, logic units, or devices illustrated in FIG. 10.

The chipset 1020 may communicate with a bus 1040 using a point-to-point PtP interface circuit 1041. The bus 1040 may have one or more devices that communicate with it, such as a bus bridge 1042 and I/O devices 1043. Via a bus 1044, the bus bridge 1043 may communicate with other devices such as a keyboard/mouse 1045, communication devices 1046 (such as modems, network interface devices, or other communication devices that may communicate with the computer network 803), audio I/O device, and/or a data storage device 1048. The data storage device 1048 (which may be a hard disk drive or a NAND flash based solid state drive) may store code 1049 that may be executed by the processors 1002 and/or 1004.

The following pertains to further examples.

Example 1 is an electronic device comprising a processor, and a memory, comprising a memory device comprising a volatile memory and a controller coupled to the memory and comprising logic, at least partially including hardware logic to receive a write data unit, implement a polarity based transfer function on the write data unit to generate a transformed data unit, and write the transformed data unit to the nonvolatile memory.

In Example 2, the subject matter of Example 1 can optionally include logic, at least partially including hardware logic, to detect a write data unit which includes only zeros and convert the write data unit to a transformed data unit which includes a predetermined number.

In Example 3, the subject matter of any one of Examples 1-2 can optionally include logic, at least partially including hardware logic, to detect a write data unit which includes the predetermined number and convert the write data unit to a transformed data unit which includes all zeroes.

In Example 4, the subject matter of any one of Examples 1-3 can optionally include logic, at least partially including hardware logic, to receive a read request for the transformed data unit, retrieve the transformed data unit from memory, and implement a polarity based transfer function on the transformed data unit to generate the write data unit and return the write data unit to in response to the request.

In Example 5, the subject matter of any one of Examples 1-4 can optionally include logic, at least partially including hardware logic, to detect a transformed data unit which includes only zeros and convert the transformed data unit to a write data unit which includes a predetermined number.

In Example 6, the subject matter of any one of Examples 1-5 can optionally include logic, at least partially including hardware logic, to detect a transformed data unit which includes the predetermined number and convert the transformed data unit to a write data unit which includes all zeroes.

In Example 7, the subject matter of any one of Examples 1-6 can optionally include logic, at least partially including hardware logic, to generate a scrambler code and apply the scrambler code the write data unit to generate a transformed data unit.

In Example 8, the subject matter of any one of Examples 1-7 can optionally include logic, at least partially including hardware logic, to receive a read request for the transformed data unit, retrieve the transformed data unit from memory and unscramble the transformed data unit to generate the write data unit; and return the write data unit to in response to the request In various examples, the operations discussed herein, e.g., with reference to FIGS. 1-10, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed herein.

Reference in the specification to "one example" or "an example" means that a particular feature, structure, or characteristic described in connection with the example may be included in at least an implementation. The appearances of the phrase "in one example" in various places in the specification may or may not be all referring to the same example.

Also, in the description and claims, the terms "coupled" and "connected," along with their derivatives, may be used. In some examples, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although examples have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An apparatus comprising:
a communication interface; and
a controller to include logic, the logic to:
  receive a data unit via the communication interface;
  detect whether the data unit includes only logic zeros or includes a predetermined number of logic ones and at least one logic zero;
  convert the data unit to a first transformed data unit that includes the predetermined number of logic ones and at least one logic zero if the data unit includes only logic zeros;
  convert the data unit to a second transformed data unit that includes only logic zeros if the data unit includes the predetermined number of logic ones and at least one logic zero; and
  cause the first transformed data unit or the second transformed data unit to be written to a memory.

2. The apparatus of claim 1, further comprising the logic to:
receive a read request for the data unit via the communication interface;
detect that the data unit was converted to the first transformed data unit that includes the predetermined number of logic ones and at least one logic zero;
cause an inverse transfer function to be implemented on the first transformed data unit to generate the data unit that includes only logic zeros; and
cause the data unit to be returned in response to the read request.

3. The apparatus of claim 1, further comprising the logic to:
receive a read request for the data unit;
detect that the data unit was converted to the second transformed data unit that includes only logic zeros;
cause an inverse transfer function to be implemented on the second transformed data unit to generate the data unit that includes the predetermined number of logic ones and at least one logic zero; and
cause the data unit to be returned in response to the read request.

4. The apparatus of claim 1, the predetermined number of logic ones and at least one logic zero comprises entirely logic ones, except for one logic zero.

5. The apparatus of claim 1, the memory comprises one of a volatile memory or a non-volatile memory.

6. The apparatus of claim 1, comprising the communication interface coupled with a communication bus, the communication bus coupled with a memory interface of a processor package, the memory interface to include a serial ATA (SATA) interface or a PCI express (PCIe) interface.

7. An apparatus comprising:
memory; and
a controller coupled with the memory, the controller to include logic to:
  detect whether a data unit to be written to the memory includes only logic zeros or includes a predetermined number of logic ones and at least one logic zero;
  convert the data unit to a first transformed data unit that includes the predetermined number of logic ones and at least one logic zero if the data unit includes only logic zeros;
  convert the data unit to a second transformed data unit that includes only logic zeros if the data unit includes the predetermined number of logic ones and at least one logic zero; and
  cause the first transformed data unit or the second transformed data unit to be written to the memory.

8. The apparatus of claim 7, further comprising the logic to:
receive a read request for the data unit;
detect that the data unit was converted to the first transformed data unit that includes the predetermined number of logic ones and at least one logic zero;
cause an inverse transfer function to be implemented on the first transformed data unit to generate the data unit that includes only logic zeros; and
cause the data unit to be returned in response to the read request.

9. The apparatus of claim 7, further comprising the logic to:
receive a read request for the data unit;
detect that the data unit was converted to the second transformed data unit that includes only logic zeros;
cause an inverse transfer function to be implemented on the second transformed data unit to generate the data unit that includes the predetermined number of logic ones and at least one logic zero; and
cause the data unit to be returned in response to the read request.

10. The apparatus of claim 7, the predetermined number of logic ones and at least one logic zero comprises entirely logic ones, except for one logic zero.

11. The apparatus of claim 7, the memory comprises one of a volatile memory or a non-volatile memory.

12. A system comprising:
a processor; and
a memory device that includes a volatile memory or a non-volatile memory and a controller, the controller to include logic to:
  detect whether a data unit to be written to the volatile memory or the non-volatile memory includes only logic zeros or includes a predetermined number of logic ones and at least one logic zero;
  convert the data unit to a first transformed data unit that includes the predetermined number of logic ones and at least one logic zero if the data unit includes only logic zeros;
  convert the data unit to a second transformed data unit that includes only logic zeros if the data unit includes the predetermined number of logic ones and at least one logic zero; and cause the first transformed data unit or the second transformed data unit to be written to one of the volatile memory or the non-volatile memory.

13. The system of claim 12, further comprising the logic to:
   receive a read request for the data unit;
   detect that the data unit was converted to the first transformed data unit that includes the predetermined number of logic ones and at least one logic zero;
   cause an inverse transfer function to be implemented on the first transformed data unit to generate the data unit that includes only logic zeros; and
   cause the data unit to be returned in response to the read request.

14. The system of claim 12, further comprising the logic to:
   receive a read request for the data unit;
   detect that the data unit was converted to the second transformed data unit that includes only logic zeros;
   cause an inverse transfer function to be implemented on the second transformed data unit to generate the data unit that includes the predetermined number of logic ones and at least one logic zero; and
   cause the data unit to be returned in response to the read request.

15. The system of claim 12, the predetermined number of logic ones and at least one logic zero comprises entirely logic ones, except for one logic zero.

16. The system of claim 12, the memory device comprises a non-volatile direct in-line memory module (NV-DIMM).

17. An apparatus comprising:
   a communication interface; and
   a controller to include logic, the logic to:
      receive a data unit via the communication interface;
      detect whether the data unit includes only logic zeros and whether a memory address for storing the data unit to a memory has a lower energy state for storing logic zeros to the memory address compared to storing logic ones at the memory address;
      convert the data unit to a first transformed data unit that includes only logic ones if the memory address does not have a lower energy state for storing logic zeros and the data unit includes only logic zeros;
      generate a scrambler code if the data unit does not include only logic zeros, determine whether the data unit matches the scrambler code, apply the scrambler code to the data unit to convert the data unit to a second transformed data unit if the data unit does not match the scrambler code and invert the second transformed data unit if the memory address does not have a lower energy state for storing logic zeros; and
      cause the first transformed data unit, the second transformed data unit or the inverted second transformed data unit to be written to the memory.

18. The apparatus of claim 17, further comprising the logic to:
   receive a read request for the data unit via the communication interface;
   detect that the data unit was converted to the second transformed data unit that does not include all zeros;
   cause the second transformed data unit to be unscrambled using the scrambler code to generate the data unit; and
   cause the data unit to be returned in response to the read request.

19. The apparatus of claim 17, the memory comprises one of a volatile memory or a non-volatile memory.

20. The apparatus of claim 17, comprising the communication interface coupled with a communication bus, the communication bus coupled with a memory interface of a processor package, the memory interface to include a serial ATA (SATA) interface or a PCI express (PCIe) interface.

* * * * *